United States Patent [19]

Raghava et al.

[11] Patent Number: 5,882,954
[45] Date of Patent: Mar. 16, 1999

[54] METHOD FOR ADHERING A METALLIZATION TO A SUBSTRATE

[75] Inventors: Ram Singh Raghava, Ann Arbor; Andrew Z. Glovatsky, Livonia; Jay DeAvis Baker, W. Bloomfield; Michael George Todd, South Lyon, all of Mich.

[73] Assignee: Ford Motor Company, Dearborn, Mich.

[21] Appl. No.: 944,506

[22] Filed: Oct. 6, 1997

[51] Int. Cl.[6] .......................... H01L 21/44; H01L 21/48; H01L 21/50
[52] U.S. Cl. .......................... 438/119; 438/106; 438/118
[58] Field of Search .......................... 438/119, 118, 438/106

[56] References Cited

U.S. PATENT DOCUMENTS

| | | |
|---|---|---|
| 2,912,745 | 8/1959 | Steigerwalt et al. . |
| 2,971,249 | 9/1961 | Anderson et al. . |
| 3,560,257 | 2/1971 | Schneble, Jr. et al. . |
| 4,100,312 | 7/1978 | Lombardo et al. . |
| 4,465,538 | 8/1984 | Schmoock . |
| 4,640,866 | 2/1987 | Suzuki . |
| 4,935,090 | 6/1990 | Brower . |
| 5,265,329 | 11/1993 | Jones et al. . |
| 5,390,412 | 2/1995 | Gregoire . |
| 5,451,755 | 9/1995 | Gregoire . |
| 5,541,366 | 7/1996 | Maoz et al. . |
| 5,559,056 | 9/1996 | Weiler ...................................... 438/612 |
| 5,578,527 | 11/1996 | Chang et al. ........................... 438/119 |
| 5,656,551 | 8/1997 | Corbett et al. ........................... 438/118 |
| 5,668,059 | 9/1997 | Christie et al. .......................... 438/118 |
| 5,728,606 | 3/1998 | Laine ....................................... 438/108 |

*Primary Examiner*—Kevin M. Picardat
*Assistant Examiner*—Deven Collins
*Attorney, Agent, or Firm*—Leslie C. Hodges

[57] ABSTRACT

There is disclosed herein a method for adhering metallizations to a substrate, comprising the steps of: (1) providing a substrate having a first surface; (2) applying a coating atop the first surface, such that the coating has a second surface bonded to the first surface, and a third surface generally conforming with the second surface; (3) etching away material from the third surface, so as to roughen and form pits in the third surface; and (4) attaching a metallization to the pits in the third surface by plating, sputtering, or similar means.

20 Claims, 2 Drawing Sheets

METHOD FOR ADHERING A METALLIZATION TO A SUBSTRATE

BACKGROUND OF THE INVENTION

1. Field of the Invention

The present invention relates generally to printed circuit board substrates. More particularly, the present invention relates to a method for adhering a metallization to a printed circuit board substrate.

2. Disclosure Information

Traditional printed circuit boards (PCBs) generally consist of a flat, planar non-conducting substrate which carries conductive circuit traces thereon. The method for producing such PCBs typically involves (1) providing a laminate of epoxy-impregnated fiberglass, (2) placing a copper foil metallization on the laminate, (3) pressing and heating the laminate/foil until the epoxy is cured, and then (4) etching away some of the copper metallization until only the desired circuit traces of copper remain attached to the laminate.

Some applications require that the substrate have a contoured, curved surface, rather than being flat. An example of this might be a device which has a contoured plastic housing, wherein the housing itself is to serve as the substrate for circuit traces, mounting pads, and connectors. However, it is often difficult to adhere metallizations onto non-planar substrates, because of the non-planarity of such substrates, the poor platability of and/or adhesion to the substrate materials, etc.

It would be desirable, therefore, to provide a method for adhering a metallization to a non-planar and/or poorly platable substrate such that good adhesive strength would be provided therebetween.

SUMMARY OF THE INVENTION

The present invention overcomes the disadvantages of the prior art by providing a method for adhering metallizations to a substrate, comprising, in a first embodiment, the steps of: (1) providing a substrate having a first surface; (2) applying a coating atop the first surface, such that the coating has a second surface bonded to the first surface, and a third surface generally conforming with the second surface; (3) etching away material from the third surface, so as to roughen and form pits in the third surface; and (4) attaching a metallization to the pits in the third surface by plating, sputtering, or similar means. The resulting metallized substrate may then be selectively etched such that only the desired circuit trace portions of the metallization remain attached to the coating/substrate.

It is an advantage that the present invention may be used to metallize non-planar substrates.

It is a further advantage that the present invention produces metallizations that are strongly adhered to the substrate.

These and other advantages, features and objects of the invention will become apparent from the drawings, detailed description and claims which follow.

DETAILED DESCRIPTION OF THE PREFERRED EMBODIMENTS

Figure 1:
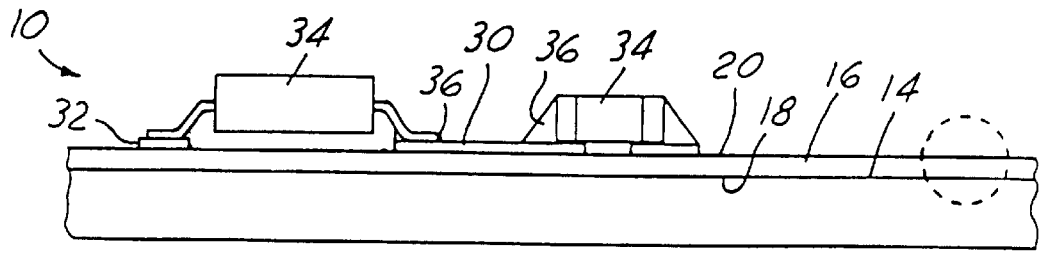
FIG. 1 is side view of a printed circuit board according to the present invention.

Referring now to the drawings, FIG. 1 shows a PCB 10 produced according to a method of the present invention. The PCB 10 is produced by: (1) providing a substrate 12 having a first surface 14; (2) applying a coating 16 atop the first surface 14, such that the coating 16 has a second surface 18 bonded to the first surface 14, and a third surface 20 generally conforming with the second surface 18; (3) etching away material from the third surface 20, so as to roughen and provide small pits or microvoids 24 in the third surface 20; and (4) attaching a metallization 26 to the pits 24 in the third surface 20. According to this method, the small pits 24 in the coating surface 20 provide sites to which the metallization 26 may be attached by plating, sputtering, evaporating, thermal spraying, or other similar means. As metallization particles are deposited onto the surface 20, they mechanically anchor to the pits 24 and interlock together so as to form a metallization layer 26 on the coating surface 20.

The substrate 12 may be made of either a thermoplastic or a thermoset material, and its top surface 14 may be either flat (as in traditional PCB substrates) or non-planar (i.e., curved).

The coating 16 must be selected so as to be capable of directly bonding to the first surface 14 of the substrate 12. It is also desirable that the coating 16 have a low modulus of elasticity in order to accommodate flexure of the substrate/metallization 12/26 (i.e., such that the coating 16 may deform commensurately with any flexure of the substrate 12 without separating therefrom). It may also be desirable that the coating 16 have a coefficient of thermal expansion between that of the substrate 12 and the metallization 26 so as to act as a thermomechanical decoupling layer therebetween.

In a first embodiment, the coating 16 may be a semi-crystalline to amorphous thermoplastic polymer, such as polyetherimide or acrylonitrile-butadiene-styrene (ABS). (As used herein, "semi-crystalline" refers to a polymer having less than 95% crystallinity.) In a second embodiment, the coating 16 may be a resin 16r mixed with a chemically etchable additive 16a. The resin 16r may be a thermoplastic material (such as ABS, polyetherimide, etc.) or a thermoset material (such as an epoxy, a polyester, a polyurethane, silicone, or the like), while the additive 16a may be a semi-crystalline to amorphous thermoplastic, an elastomer, or both. (If both the resin 16r and the additive 16a are thermoplastics, then each must be a different material from the other.)

Figure 2:
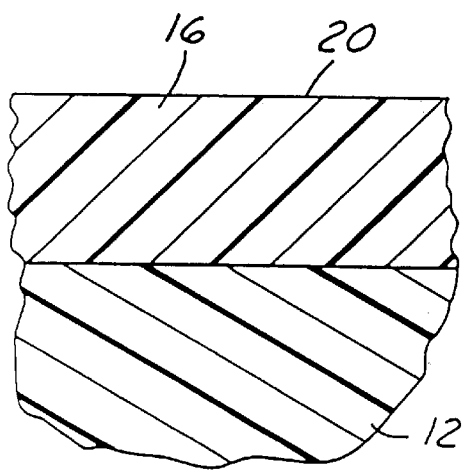
FIGS. 2 and 3 are magnified cross-section views of a portion of the coating surface of FIG. 1 before and after chemical etching, respectively, according to a first embodiment of the present invention.
Figure 3:
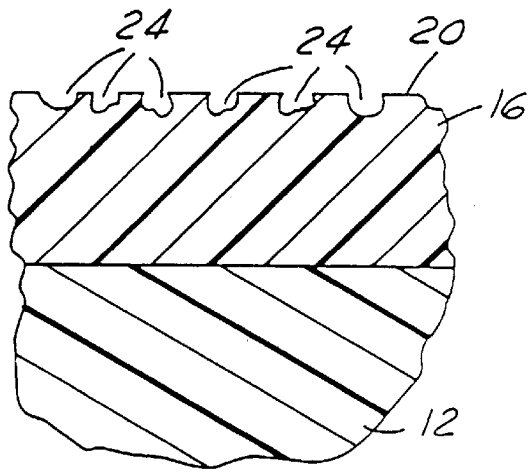

Because highly crystalline polymers are very difficult to chemically etch, the coating of the first embodiment is chosen to be semi-crystalline to amorphous in order that the coating third surface 20 be etchable by exposure to a chemical etchant. This etching creates small pits 24 in the third surface 20 which greatly facilitate the attachment of a copper or other metallization 26 thereto by such means as plating, sputtering, or the like. FIGS. 2 and 3 show magnified cross-section views of the third surface 20 before and after etching, respectively.

Figure 4:
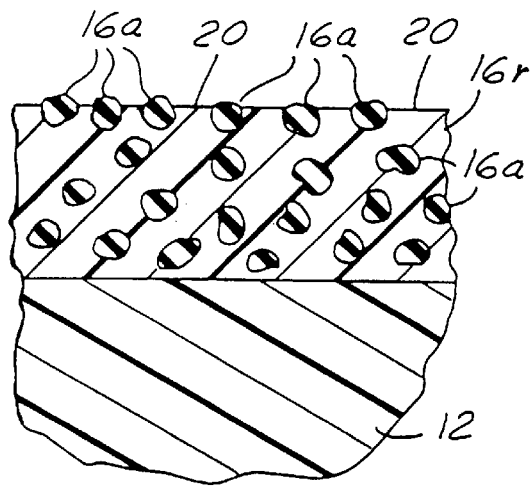
FIGS. 4 and 5 are magnified cross-section views of a portion of the coating surface of FIG. 1 before and after chemical etching, respectively, according to a second embodiment of the present invention.
Figure 5:
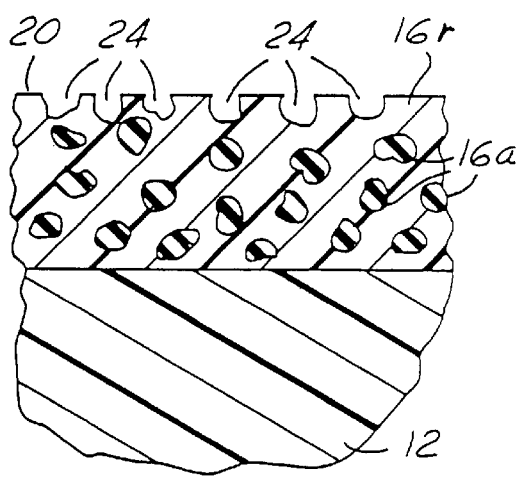

In the second embodiment, a chemical etchant may be applied to the third surface 20 which will etch away substantially only those particles of additive 16a that are partially exposed and partially embedded within the third surface 20. Alternatively, a somewhat stronger etchant may be used which will soften the third surface 20 somewhat so that the etchant may further dissolve additive particles 16a that lie immediately beneath the third surface. FIGS. 4 and 5 show magnified cross-section views of a portion of the third surface 20 before and after application of the chemical etchant, respectively. Note that the exposed particles of additive 16a shown in FIG. 4 have been etched away to leave pits 24 thereat in FIG. 5. As in the first embodiment, these pits 24 facilitate the attachment of the metallization 26 thereto.

By use of the coating 16 of either embodiment, a metallization 26 can be easily attached to a plastic substrate 12. Once the metallization 26 is attached, a further step of selectively etching the metallization can be performed whereby a desired circuit pattern of circuit traces 30 and mounting pads 32 can be formed on the third surface 20. Electronic components 34 may then be connected to the circuit by attaching the component terminations to their respective mounting pads 32 via solder joints 36.

The chemical etchant to use in either embodiment depends upon the coating used, and should be chosen so that it is strong enough to roughen the third surface 20 without structurally weakening the coating 16. For example, in the first embodiment, ABS may be etched with a chromic acid/sulfuric acid solution; polyetherimide may be etched with methyl-ether-ketone (MEK), chloroform, trichloroethylene, or a chromic acid/sulfuric acid solution; Nylon 6 or 6/6 (polyamide) may be etched with trichloroacetic acid, formic/acetic/other carboxylic acids, or calcium/aluminum salts; polyethylene terephthalate (PET) may be etched using sulfuric or chromic/sulfuric acid; and so forth.

In the second embodiment, an etchant should be chosen that substantially dissolves the exposed particles of additive 16a without substantially attacking the resin 16r. For example, if the resin 16r is a thermoset epoxy and the additive 16a is an elastomer, such as an amine- or carboxy-terminated butadiene nitrile elastomer, a strong polar solvent (e.g., MEK, acetone, etc.) should be used if the resin 16r is in B-stage (i.e., only partially cured), or if the resin 16r is in C-stage (i.e., fully or appreciably cured) then fuming sulfuric acid, strong nitric acid, or a chromic acid/sulfuric acid blend should be used. If the additive 16a is a semi-crystalline to amorphous thermoplastic (e.g., ABS, PET, etc. as discussed immediately above), then an appropriate etchant (as discussed above) should be used therewith. A wide variety of other materials and appropriate etchants may also be used, as will be apparent to those skilled in the art to which the present invention pertains.

Figure 8:
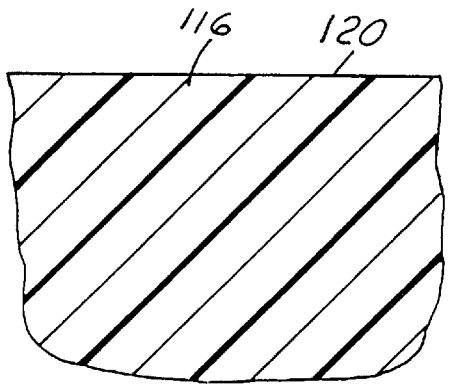
FIGS. 8 and 9 are magnified cross-section views of a portion of the substrate surface before and after chemical etching, respectively, according to a fourth embodiment of the present invention.
Figure 9:
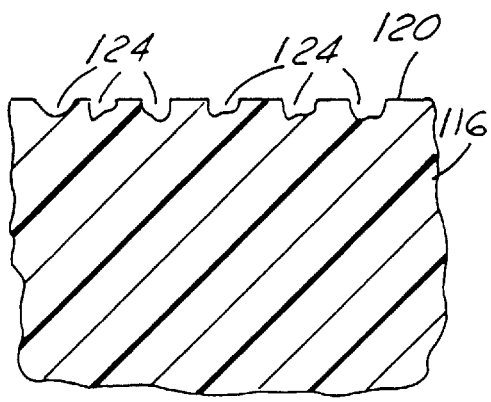

It is also possible to combine the features of the coating 16 and substrate 12 of the first embodiment shown in FIGS. 2 and 3 to create a third embodiment, illustrated in FIGS. 8 and 9. In this embodiment, no coating is applied to the substrate; rather, the substrate 116 itself is etched by applying an etchant to the top surface 120 thereof, thereby creating pits 124 therein.

Figure 6:
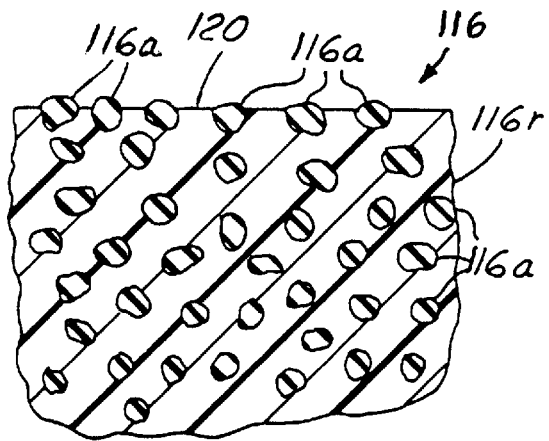
FIGS. 6 and 7 are magnified cross-section views of a portion of the substrate surface before and after chemical etching, respectively, according to a third embodiment of the present invention.
Figure 7:
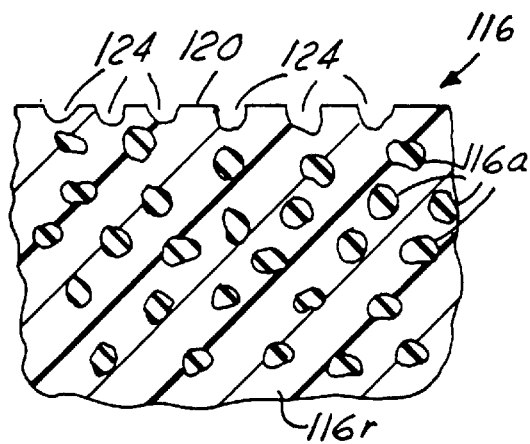

Similarly, the substrate 12 and coating 16a/16r of the second embodiment of FIGS. 4 and 5 may be combined to create a fourth embodiment, as illustrated in FIGS. 6 and 7. In this embodiment, the entire substrate 116 is molded out of a plastic resin 116r having additives 116a dispersed therein. A metallization may be attached to a substrate according to this embodiment by: (1) providing a substrate 116 having a top surface 120, wherein the substrate 116 is made of a resin 116r having a chemically etchable additive 116a dispersed therein; (2) etching away particles of the additive 116a from the top surface 120, so as to roughen or pit this surface; followed by (3) attaching a metallization to this roughened surface 120 by plating, sputtering, or other similar means.

Various other modifications to the present invention will, no doubt, occur to those skilled in the art to which the present invention pertains. For example, the etching away step may be accomplished by abrading or other mechanical, non-chemical means, rather than by exposure to a chemical etchant. Also the pits or microvoids 24 caused by etching may take on a variety of different shapes, depths, spacings, and configurations, including but not limited to pits, craters, crevices, and microcracks. Moreover, the metallization 26 may not only be made of copper, but may comprise copper, aluminum, chromium, palladium, gold, nickel, tin, lead, and/or silver. It is the following claims, including all equivalents, which define the scope of the present invention.

What is claimed is:

1. A method for adhering a metallization to a substrate, comprising the steps of:

providing a substrate having a first surface;

applying an electrically insulative coating atop said first surface, such that said coating has a second surface bonded to said first surface, and a third surface generally conforming with the second surface;

etching away material from said third surface, so as to roughen and form pits in said third surface; and attaching a metallization to said pits in said third surface.

2. A method according to claim 1, wherein said coating is capable of directly bonding to said first surface.

3. A method according to claim 1, wherein said first surface of said substrate is non-planar.

4. A method according to claim 1, wherein said coating is a semi-crystalline to amorphous thermoplastic polymer.

5. A method according to claim 1, wherein said coating comprises a thermoset resin and a chemically etchable additive.

6. A method according to claim 5, wherein said material etched away from said third surface is substantially only of said additive.

7. A method according to claim 5, wherein said thermoset resin is an epoxy, a polyester, a polyurethane, or a silicone.

8. A method according to claim 5, wherein said additive is a semi-crystalline to amorphous thermoplastic polymer.

9. A method according to claim 5, wherein said additive is an elastomer.

10. A method according to claim 9, wherein said elastomer is an amine- or carboxy-terminated butadiene nitrile elastomer.

11. A method according to claim 1, wherein said etching away step comprises applying a chemical etchant to said third surface.

12. A method according to claim 1, wherein said attaching step comprises plating, sputtering, evaporating, or thermal spraying said metallization onto said third surface.

13. A method according to claim 1, wherein said metallization comprises at least one of copper, aluminum, chromium, palladium, gold, nickel, tin, lead, and silver.

14. A method according to claim 1, further comprising, after said attaching step, the step of selectively etching the metallization so as to form a circuit pattern on said third surface.

15. A method according to claim 1, wherein said coating has a coefficient of thermal expansion between those of said substrate and said metallization.

16. A method according to claim 1, wherein said coating has a low modulus of elasticity so as to accommodate flexure of said substrate.

17. A method for adhering a metallization to a substrate, comprising the steps of:

providing a substrate having a first surface;

applying an electrically insulative coating atop said first surface, such that said coating has a second surface bonded to said first surface, and a third surface generally conforming with the second surface, wherein said coating comprises a resin having a chemically etchable additive dispersed therein;

etching away particles of said additive from said third surface, so as to roughen and form pits in said third surface; and attaching a metallization to said pits in said third surface.

18. A method according to claim 17, wherein said coating is capable of directly bonding to said first surface.

19. A method for adhering a metallization to a substrate, comprising the steps of:

providing a substrate having a top surface, wherein said substrate is made of a resin having an electrically insulative chemically etchable additive dispersed therein;

etching away particles of said additive from said top surface, so as to roughen and form pits in said top surface; and attaching a metallization to said pits in said top surface.

20. A method according to claim 19, wherein said attaching step comprises plating, sputtering, evaporating, or thermal spraying said metallization onto said top surface.

* * * * *